United States Patent [19]

Gafarov et al.

[11] 4,133,048

[45] Jan. 2, 1979

[54] INTEGRATED SEMICONDUCTOR DYNAMIC MEMORY

[76] Inventors: Palmir M. Gafarov, 103489, korpus 614, kv. 26; Jury V. Minkov, 103527, korpus 903, kv. 155; Vladimir I. Solomonenko, 103489, korpus 710, kv. 73, all of Moscow, U.S.S.R.

[21] Appl. No.: 835,664

[22] Filed: Sep. 22, 1977

[30] Foreign Application Priority Data

Sep. 30, 1976 [SU] U.S.S.R. .............................. 2406945

[51] Int. Cl.² .............................................. G11C 7/06
[52] U.S. Cl. .................................... 365/208; 365/72; 365/189; 365/149
[58] Field of Search ................. 365/208, 189, 230, 72, 365/207

[56] References Cited

U.S. PATENT DOCUMENTS

| | | | |
|---|---|---|---|
| 3,969,706 | 7/1976 | Proebsting et al. ................... | 365/207 |
| 4,031,522 | 6/1977 | Reed et al. ........................... | 365/208 |

*Primary Examiner*—Stuart N. Hecker
*Attorney, Agent, or Firm*—Lackenbach, Lilling & Siegel

[57] ABSTRACT

A memory using MOS (metal-oxide-semiconductor) structures comprises a memory matrix of an even number of memory cells divided into two groups. One terminal of every cell is connected to a respective select bus located along a memory matrix line. The other terminal of memory cells in a first group of memory cells is connected to a first number bus of the respective matrix column and the other terminal of memory cells in a second group of memory cells is connected to a second number bus of the respective matrix column located parallel to the first number bus. Memory cells of different groups are connected to respective number buses so that along the column they are interspaced by at least one memory cell. Data terminals of column differential amplifiers are connected to the respective number buses of the respective matrix columns. At least one of the number buses of every column is connected, via a respective matrix column select key, to numeric data input/output buses.

1 Claim, 1 Drawing Figure

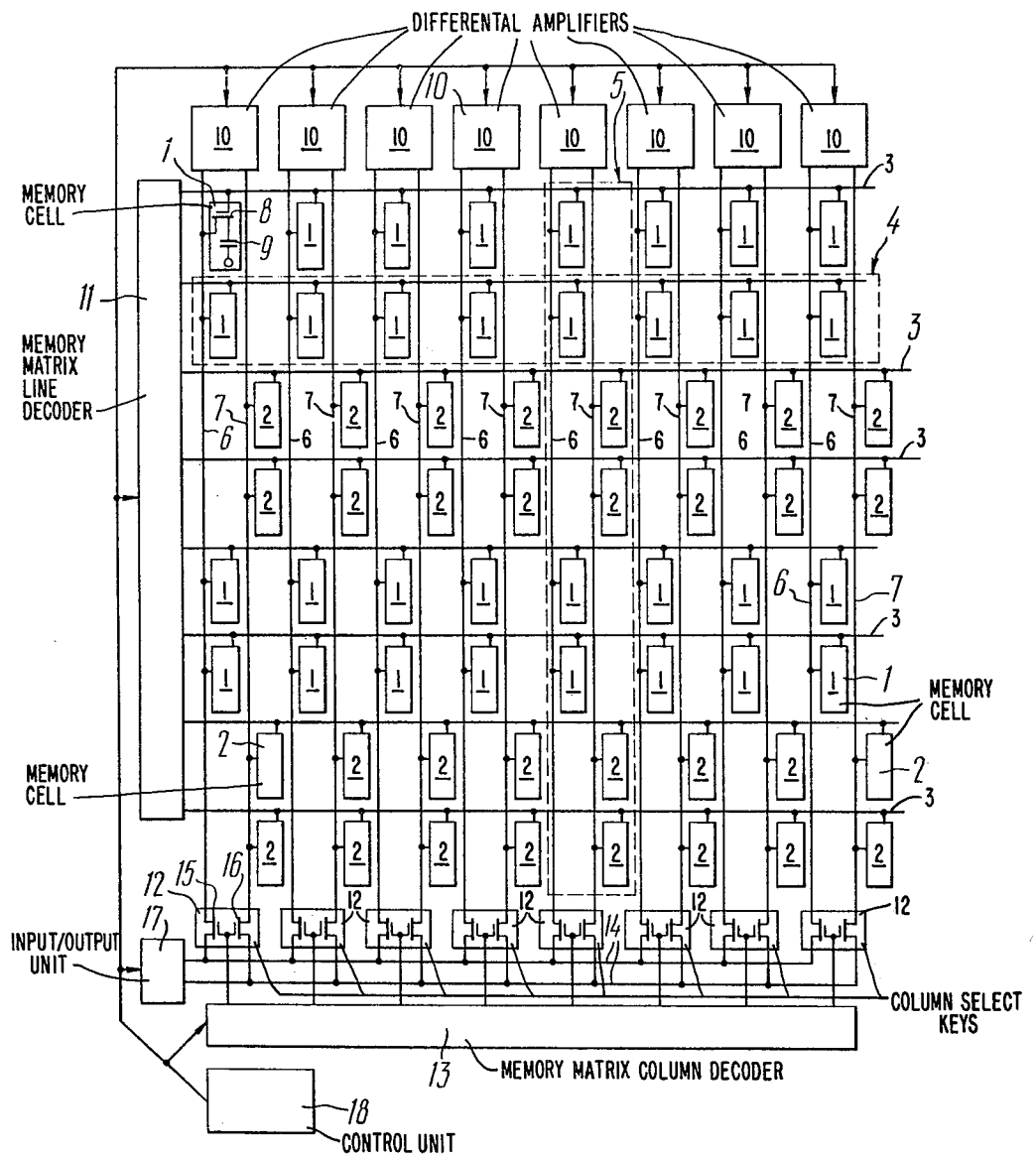

INTEGRATED SEMICONDUCTOR DYNAMIC MEMORY

DESCRIPTION OF THE PRIOR ART

The prior art knows of an integrated semiconductor dynamic memory comprising a memory matrix of an even number of memory cells divided into two groups, one terminal of every cell being connected to a respective select bus located along a matrix line, and the other terminal being connected to a respective number bus located along a matrix column. Every matrix column of the memory includes a differential amplifier whose signal outputs are connected to a number bus of the matrix column. All the select buses of the memory matrix are connected to a matrix line decoder and all the number buses of the memory matrix are connected electrically, via column select keys controlled by a matrix column decoder, to numeric data input/output buses connected to a numeric data input/output unit. The outputs of the memory control circuit are connected to respective control inputs of the column differential amplifiers, of the matrix line and column decoders and of the numeric data input/output unit. Every matrix column number bas has a gap in its middle which divides it into two equal sections. Occupying the gap is a respective reading differential amplifer which has each of its signal outputs connected to the respective part of the number bus. Said second terminal of each of the memory cells in the first group arranged along the number bus in one direction with respect to the differential amplifier is connected to one section of the number bus. Connected to the other section of the number bus is the second terminal of memory cells in the second group which are also arranged along the number bus but in the opposite direction with respect to the differential amplifier. Every memory cell comprises a switching-type transistor and a data potential holding capacitor made as a MOS-structures (see, for instance, Electronics, No. 19, 1973, pp. 43-51).

The sections of the column number bus out in opposite directions with respect to the differential amplifier so that the distance between them is quite considerable. This distance as well as the non-uniformity of electrical and physical parameters of a semiconductor structure and the peculiarities of the MOS-structure production process make it rather difficult to obtain highly identical parameters (stray electric capacitances) in the sections of a number bus that perform the functions of the arms of a differential amplifier.

When a differential amplifier is driven into the active state, a transient is generated which causes a potential change in the arms of the differential amplifier.

In the event the stray capacitances of the number bus sections are different the potential change in the differential amplifier arms will also be different. Thus, there will appear a spurious voltage reducing the sensitivity of the differential amplifier to the information voltage across its arms.

Furthermore, the sensitivity decreases due to the difference in conditions under which interference signals affect number bus sections located far from one another.

SUMMARY OF THE INVENTION

An object of the invention is to design an integrated semiconductor dynamic memory in which the arms of differential amplifiers would have identical parameters.

Another object of the invention is to provide similar conditions under which interference signals affect the arms of differential amplifiers.

The primary object of the invention is to increase the sensitivity of differential amplifiers used in memory devices.

In accordance with the above and other objects the essence of the present invention consists in that an integrated semiconductor dynamic memory comprises: a memory matrix with an even number of memory cells divided into two groups, one terminal of every cell being connected to a respective select bus located along a matrix line and the other terminal of memory cells in a first group of memory cells being connected to a respective number bus located along a matrix column; differential amplifiers for each of the matrix columns, one of the information terminals of each amplifier being connected to the number bus of the respective column, all the select buses of the memory matrix being connected to a matrix line decoder and all the number buses of the memory matrix being electrically connected, via column select keys controlled by the matrix column decoder, to numeric data input/output buses connected to a numeric data input/output unit; and a control unit whose outputs are connected to respective control inputs of the column differential amplifiers, of the matrix line and column decoders and of the numeric data input/output unit. According to the invention, every column of the memory matrix, in addition to said number bus, is provided with another number bus which is arranged parallel to the first number bus and is connected to the other data terminal of the differential amplifier of the column and the other terminal of every memory cell in the second group of the column memory cells. The memory elements of different groups are connected to number buses so that along the column they are interspaced by at least one cell.

BRIEF DESCRIPTION OF THE DRAWINGS

The invention will be better understood from the description of an embodiment given by way of example with reference to the accompanying drawing which shows a block diagram of the integrated semiconductor dynamic memory, according to the invention.

DETAILED DESCRIPTION OF THE INVENTION

The integrated semiconductor dynamic memory comprises a memory matrix of an even number of memory cells 1 and 2. The memory cells 1 form a first group of memory cells and the memory cells 2 form a second group of memory cells. One terminal of each of the memory cells 1 and 2 in both groups is connected to a respective select bus 3 located along a respective line 4 of the memory matrix. Every column 5 of the matrix is provided with parallel number buses 6 and 7, a second terminal of the memory cell 1 in the first group being connected to the number bus 6 and a second terminal of the memory cells 2 in the second group being connected to the number bus 7. At the same time, the memory cells 1 and 2 belonging to different groups are connected to these number buses 6 and 7 so that along the column 5 they are arranged in pairs, i.e. all the odd cell pairs are connected, for instance, to the bus 6, while all the even cell pairs are connected to the bus 7.

Every memory cell 1 and 2 comprises a switching-type, transistor 8, such as a FET, and a data potential holding capacitor 9.

Each of the memory matrix columns 5 is provided with a respective differential amplifier 10, one of the data terminals of the respective amplifier being connected to the number bus 6 of the column 5 and the other data terminal being connected to the number bus 7 of the column 5.

All the select buses 3 are connected to a decoder 11 of the memory matrix lines 4.

All the number buses 6 and 7 are connected, via column select keys 12 controlled by a memory matrix column decoder 13, to numeric data input/output buses 14. Each of the matrix column select keys 12 comprises two transistors 15 and 16, such as FET transistors.

The numeric data input/output buses 14 are connected to the terminals of a numeric data input/output unit 17. In some embodiments the unit 17 is connected to only one of the number buses 6 and 7 of the column 5. In this case one bus 14 is required and each of the column select keys 12 will comprise only one of the transistors 15 and 16. In some embodiments the memory cells 1 and 2 belonging to different groups are connected to every bus 6 and 7 along the column 5 intermittently, i.e. all the odd cells are connected to the bus 6 while all the even cells are connected to the bus 7.

A control unit 18 has outputs connected to the control inputs of the decoder 11 of the memory matrix lines 4, of the decoder 13 of the memory matrix columns 5, of the differential amplifiers 10 and of the numeric data input/output unit 17.

The memory cells use n-channel MOS structures made of polycrystal silicon with two levels. The select buses 3 are made of second level polycrystal silicon, and the number buses 6 and 7 are made of aluminium.

The integrated semiconductor dynamic memory operates as follows.

Prior to the next reading of the memory, all the outputs of the decoders 11 and 13 exhibit a zero potential, due to which the transistors 8 of the memory cells 1 and 2 and the transistors 15 and 16 of the column 5 select keys 12 are off. The potentials across the number buses 6 and 7 of all the memory matrix columns 5 are equal to one another and their values correspond to the average between the levels of a logic "0" and a logic "1".

When the memory is addressed in the read-out mode, the switching-type transistors 8 of the memory cells 1 or 2 in the selected line 4 start conducting and across the number buses 6 and 7 in the column 5 there appear information voltages.

A signal delivered by the control unit 18 drives the differential amplifers 10 of the columns 5 into the active state, after which the amplifiers get fixed in one of the stable states depending on the polarity of the information voltage across the number buses 6 and 7.

Since the number buses 6 and 7 serving as the arms of the differential amplifier 10 are located at a minimal distance from one another, their stray electric capacitances will be identical while the conditions under which interference signals affect the buses 6 and 7 will be similar.

The result is that the spurious voltage across the arms of the differential amplifier 10 will drop drastically, due to which the sensitivity of the amplifier to the information voltage will increase.

A signal from the decoder 13 of the columns 5 permits the information signal that has been amplified by the differential amplifier 10 to be transmitted, via the transistors 15 and 16 of the key 12 in the selected column 5 and of the bus 14, to the inputs of the numeric data input/output unit 17.

The proposed design of an integrated semiconductor dynamic memory permits lower information voltages and, hence, reduces the size of the capacitors 9 holding these voltages, i.e. reduces the area occupied by the memory cells 1 and 2.

To profit from this advantage one can either increase the number of memory cells 1 and 2 or reduce the size of the memory matrix. In both cases, the result is a decreases of the memory cost per bit of data.

Besides, the increase of sensitivity of the amplifiers 10 makes it possible to broaden the operating temperature range and to raise the reliability of the integrated semiconductor dynamic memory.

What is claimed is:

1. An integrated semiconductor dynamic memory comprising:
    a memory matrix containing
    memory cells divided into two groups;
    a plurality of select buses of said memory matrix located along a respective matrix line;
    a plurality of first number buses of said memory matrix located along a respective matrix column;
    a plurality of second number buses of said memory matrix located along a respective matrix column parallel to said first number bus;
    memory cells of a first group of memory cells having a first termminal connected to a respective select bus and a second terminal connected to a respective first number bus;
    memory cells of a second group of memory cells having a first terminal connected to a respective select bus and a second terminal connected to a respective second number bus;
    a plurality of differential amplifiers, the number of which being equal to that of the columns in said memory matrix, having information terminals connected to respective first and second number buses;
    said memory cells belonging to different groups and connected to respective number buses so that along a column they are interspaced by at least one memory cell;
    a memory matrix line decoder to which said memory matrix select buses are connected;
    data input/output buses;
    memory matrix column select keys connecting at least one of said number buses of a respective column to said data input/output buses;
    a matrix column decoder having outputs connected to a control unit of said matrix column select keys;
    a numeric data input/output unit having outputs connected to said data input/output buses;
    a control unit having outputs connected to respective control inputs of said column differential amplifiers, of said matrix line decoder, of said matrix column decoder and of said numeric data input/output unit.

* * * * *